(12) United States Patent
Lo et al.

(10) Patent No.: US 6,455,936 B1
(45) Date of Patent: Sep. 24, 2002

(54) INTEGRATED CIRCUIT ASSEMBLY HAVING INTERPOSER WITH A COMPLIANT LAYER

(75) Inventors: Ching-Ping Lo, Rancho Palos Verdes; Gregory L. Mayhew, El Segundo; Gustavo V. Catipon, Torrance; Richard L. Singleton, Redondo Beach; Edward C. Limberg, Rancho Palos Verdes, all of CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/855,231

(22) Filed: May 14, 2001

(51) Int. Cl.[7] .................. H01L 23/485; H01L 23/04
(52) U.S. Cl. .................. 257/758; 257/730; 257/759
(58) Field of Search .................. 257/756–760, 257/730

(56) References Cited

U.S. PATENT DOCUMENTS

| | | | | |
|---|---|---|---|---|
| 5,290,588 A | * | 3/1994 | Romero et al. | 427/123 |
| 5,438,216 A | * | 8/1995 | Juskey et al. | 257/433 |
| 5,959,348 A | * | 9/1999 | Chang et al. | 257/697 |
| 6,308,938 B1 | * | 10/2001 | Futakuchi | 257/780 |
| 6,317,333 B1 | * | 11/2001 | Baba | 174/255 |
| 2001/0000648 A1 | * | 5/2001 | Akram | 324/760 |

OTHER PUBLICATIONS

IBM TDB NN9201356, Direct Chip Attach Interconnection System Using Composite Materials, Jan. 1992. vol. 34, Issue 8, pp. 356–357.*

* cited by examiner

Primary Examiner—Allan R. Wilson
(74) Attorney, Agent, or Firm—John R. Rafter; Terje Gudmestad

(57) ABSTRACT

An integrated circuit assembly includes a base board, an interposer, and an array of solder balls electrically and structurally interconnecting the interposer and the base board. The interposer has a backbone layer having a backbone stiffness, a first compliant layer affixed to the backbone layer between the backbone layer and the integrated circuit and having a first-layer stiffness of less than the backbone stiffness, and a second compliant layer affixed to the backbone layer between the backbone layer and the base board and having a second-layer stiffness of less than the backbone stiffness. An integrated circuit is supported on the interposer. The integrated circuit includes integrated-circuit bonding pads thereon and a bonding pad protective coating overlying the integrated-circuit bonding pads. An electrical interconnect extends from the integrated circuit to at least one of the solder balls, and a cover overlies and protects the integrated circuit.

20 Claims, 3 Drawing Sheets

INTEGRATED CIRCUIT ASSEMBLY HAVING INTERPOSER WITH A COMPLIANT LAYER

This invention was made with government support under contract F04701-97-C-0026, awarded by the United States Air Force. The government has certain rights in this invention.

This invention relates to an integrated circuit assembly, and more particularly to the structure by which an integrated circuit is supported from a base board.

BACKGROUND OF THE INVENTION

In one common architecture, a microelectronic circuit is prepared as a chip or a die, termed herein an integrated circuit. The integrated circuit is fragile and is typically supported on and electrically interconnected to a base board such as a printed wiring board (PWB). A cover is placed over the integrated circuit to protect it mechanically and against damage during handling, completing the integrated circuit assembly. Large numbers of integrated circuits may be supported on a single base board and under a single cover, forming a multi-chip module (MCM).

The structural and electrical interconnection between the integrated circuit and the base board may be made in a variety of ways. In one, electrical leads extend directly from the integrated circuit to interconnects on the printed wiring board. In another, solder bumps are used to join the components together. During fabrication of the integrated circuit assembly, the solder bumps are contacted to corresponding pads on the facing structure and heated to bond the components together. The solder bumps provide not only the structural and electrical interconnect, but also a heat flow path for removing heat from the integrated circuit.

This approach is operable, but the structure is subject to thermal cycling damage during fabrication processing or during service. The integrated circuit and the base board have quite different coefficients of thermal expansion. As the temperature changes, thermal strains and thermal stresses are generated within the assembly. If the thermal strains and thermal stresses become excessive, the structure may structurally and/or electronically fail at the solder bumps or elsewhere.

To overcome this problem, the solder bumps may be positioned laterally outwardly from the integrated circuit, so that the thermal strains and thermal stresses are lessened. This solution results in a larger size and weight of the assembly, as well as a lengthening of the heat flow path from the integrated circuits to the heat sink.

There is a need for an improved approach to the joining of an integrated circuit to its support to form an integrated circuit assembly. The present invention fulfills this need, and further provides related advantages.

SUMMARY OF THE INVENTION

The present invention provides an integrated circuit assembly that achieves electrical and mechanical integrity while reducing the susceptibility of the structure to thermal cycling damage. The integrated circuit assembly may be protected against corrosion damage without being hermetically sealed, thus reducing fabrication and rework difficulties. The structure of the integrated circuit itself is not altered, so that it may be prepared and optimized for its required functionality.

In accordance with the invention, an integrated circuit assembly comprises a base board, an interposer, and an array of solder balls electrically and structurally interconnecting the interposer and the base board. The interposer comprises a backbone layer having a backbone stiffness, and at least one compliant layer overlying and contacting the backbone layer. The solder balls are preferably formed of a lead-tin-base solder having a melting temperature of greater than about 210° C. The compliant layer has a compliant-layer stiffness of less than the backbone stiffness. An integrated circuit is supported on the interposer, and a cover optionally overlies and protects the integrated circuit. The cover may be a shell or a flowable encapsulant. The cover may have an opening therethrough. In most cases, an electrical interconnect extends from the integrated circuit to at least one of the solder balls, which in turn are in electrical communication with electrical conductors on the base board.

More preferably, the interposer comprises the backbone layer having the backbone stiffness, a first compliant layer affixed to the backbone layer between the backbone layer and the integrated circuit, the first compliant layer having a first-layer stiffness of less than the backbone stiffness, and a second compliant layer affixed to the backbone layer between the backbone layer and the solder balls, the second compliant layer having a second-layer stiffness of less than the backbone stiffness. The first-layer stiffness and the second-layer stiffness are preferably, but not necessarily, the same. The backbone may be made of a fiber-reinforced polymeric material, and each compliant layer is made of a compliant polymeric material which is not fiber reinforced.

The use of the compliant layer(s) reduces thermal strains and stresses generated within the structure during thermal cycling, thereby reducing the incidence of thermal-cycling failure. The life of the structure is thereby extended. This approach permits the solder balls to be vertically registered below the integrated circuit, so that the heat flow path through the solder balls is short and of low thermal impedance. Heat removal from the integrated circuit is thereby facilitated.

In one embodiment, the integrated circuit includes integrated-circuit bonding pads thereon. A protective coating overlies the integrated-circuit bonding pads. The protective coating preferably comprises a layered metal selected from the group consisting of copper-nickel/gold and titanium-tungsten/gold.

The use of the protective coating protects the integrated-circuit bonding pads against moisture damage and other corrosive effects, both in fabrication operations and in service. The remainder of the integrated circuit is ordinarily protected against moisture and other corrosion by protective layers such as silicon nitride or silicon oxide. Together, the protective coating and the protective layers encapsulate and protect the integrated circuit and its bonding pads, so that the remainder of the package may be non-hermetic without concern for corrosion damage of the integrated circuit. The cover may be provided even in this case to protect the integrated circuit against mechanical damage.

The present approach is most usefully employed where there are multiple integrated circuits which are assembled to the single base board using the described approach to make a multi-chip module (MCM). The solder reflow operations associated with assembly and, where necessary, rework of the MCM are aided by using a temporary cover with an opening therethrough to permit pressure equalization during the reflow soldering process. If one integrated circuit fails during service, the integrated circuit may be replaced easily. This non-hermetically sealed MCM is fully reworkable.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
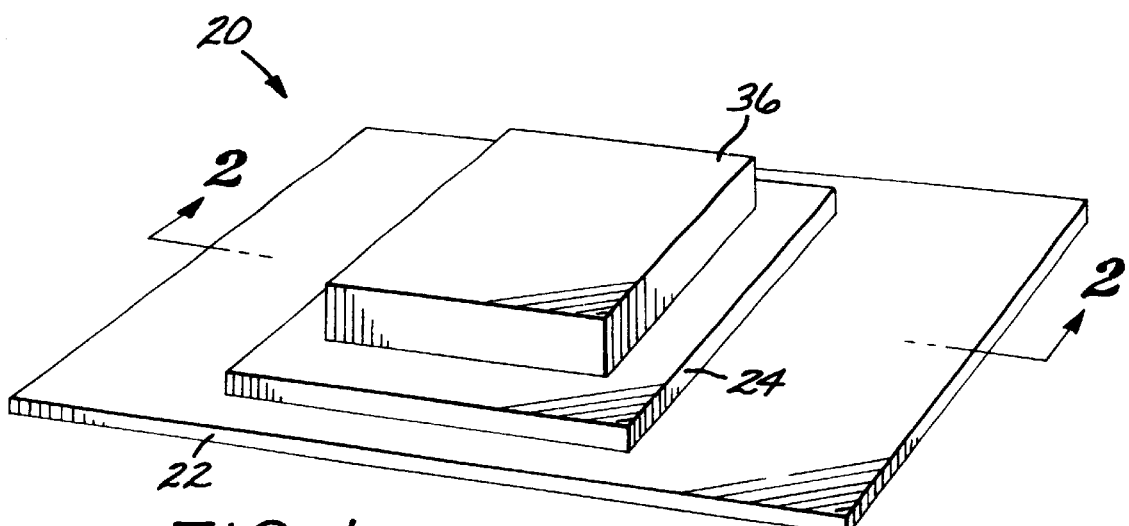
FIG. 1 is a perspective view of an integrated circuit assembly.
Figure 2:
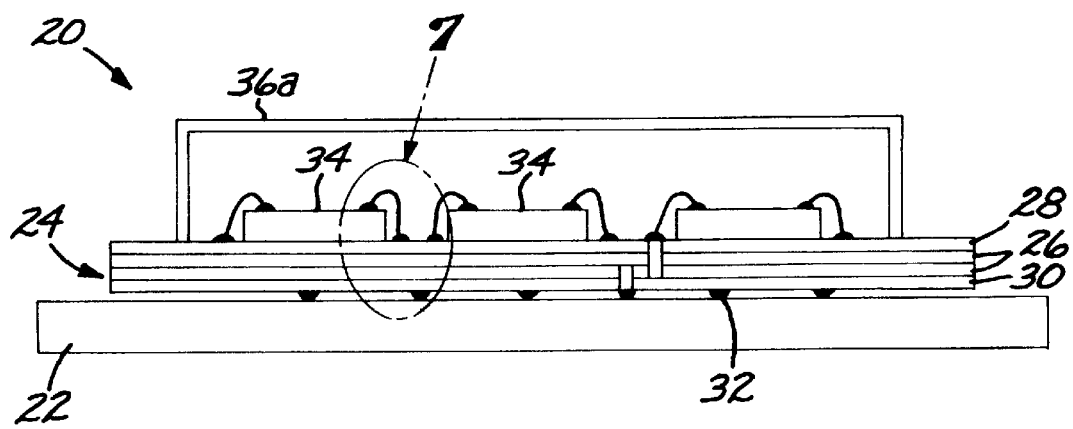
FIG. 2 is a sectional view of a first embodiment of the integrated circuit assembly of FIG. 1, taken along line 2—2.
Figure 3:
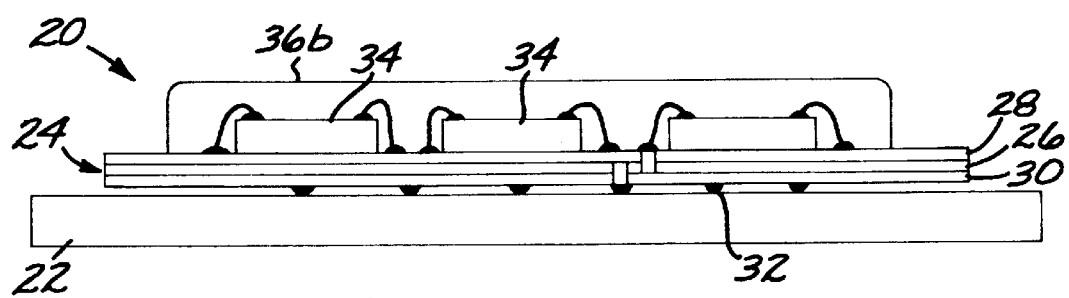
FIG. 3 is a sectional view of a second embodiment of the integrated circuit assembly of FIG. 1, taken along line 2—2.
Figure 4:
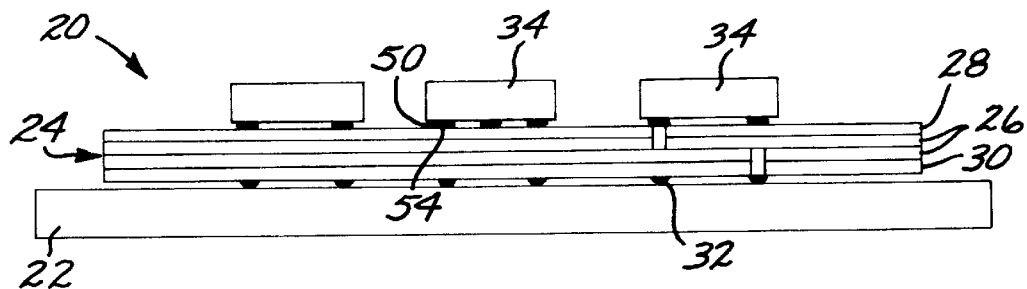
FIG. 4 is a sectional view of a third embodiment of the integrated circuit assembly similar to that of FIG. 1 but having no cover.

FIG. 1 depicts an integrated circuit assembly 20 in a general form. FIGS. 2–4 illustrate three specific preferred embodiments of the integrated circuit assembly 20. The following description applies to all of the embodiments of FIGS. 1–4, except as will be noted.

The integrated circuit assembly includes a base board 22. The base board 22 is preferably a printed wiring board (PWB) made of a polymer-base material such as a polyimide glass or epoxy glass (FR4) with appropriate metallic interconnection traces thereon.

An interposer 24 is affixed to and electrically interconnected with the base board 22. The interposer 24 comprises at least one backbone layer 26 having a backbone stiffness. There may be one, two, or more backbone layers 26. In a typical case, there are electrically conductive traces (not shown) supported on the backbone layer(s) 26, which form a portion of the electrical interconnection of the integrated circuit assembly. At least one compliant layer contacts the backbone layer(s) 26. In the preferred case, there are two compliant layers 28 and 30 contacting the backbone layer 26, one on each side of the backbone layer 26. Each of the compliant layers has a respective compliant-layer stiffness of less than the backbone stiffness. As used herein, "stiffness" is a function of the modulus of elasticity of the material or materials. That is, each of the compliant layers 28 and 30 has a lower modulus of elasticity than the backbone layer 26. The compliant layers 28 and 30 are preferably identical in construction, but need not be identical.

The backbone layer(s) 26 are preferably made of a fiber-reinforced polymer material such as a fiber-reinforced polyimide. The compliant layers 28 and 30 are preferably made of a polymer material that is not fiber-reinforced, such as a polyimide. The fiber reinforcement adds stiffness to the material, so that the compliant layers 28 and 30 are less stiff than the backbone layer(s) 26. The total thickness of the backbone layer(s) 26 is preferably about 0.015–0.020 inch.

Each of the compliant layers 28 and 30 is preferably about 0.002–0.003 inch in thickness.

An array of solder balls 32 electrically and structurally interconnects the interposer 24 and the base board 22. ("Solder ball" is a term of art for the masses of solder 32, which are also sometimes called "solder bumps". The masses need not have a round shape and instead may have any operable shape when viewed in section.) The solder balls 32 are made of a solder material such as a lead-tin-base solder. The preferred solder material is a solder that has a melting point of greater than about 210° C., such as a solder having about 97 weight percent lead, 3 weight percent tin. Such a relatively high-melting-point solder allows the solder balls 32 to remain relatively tall when they are joined to the base board traces, and thereby better suited for absorbing thermal cycling strains.

At least one integrated circuit 34 is supported on the interposer 24 and in one embodiment affixed to the interposer 24 as with an adhesive. The present invention is most advantageously utilized where there are multiple integrated circuits 34, and in FIGS. 2–4 three integrated circuits 34 are illustrated in each case. The integrated circuits 34 may be of any operable type. The design and fabrication of integrated circuits 34 are known to those skilled in the art for each specific type of integrated circuit that is required for a particular application.

The first compliant layer 28 is positioned between the integrated circuits 34 and the backbone layer(s) 26. The second compliant layer 30 is positioned between the backbone layer(s) 26 and the solder balls 32, and thence between the backbone layer(s) and the base board 22. The two compliant layers 28 and 30 may be made of the same material (and thence the same stiffness) with the same thickness, but they may instead be made of different materials with different thicknesses. The use of compliant layers 28 and 30 of the same material and thickness is preferred, as the interposer tends to stay flat in that case.

Figures 5, 6:
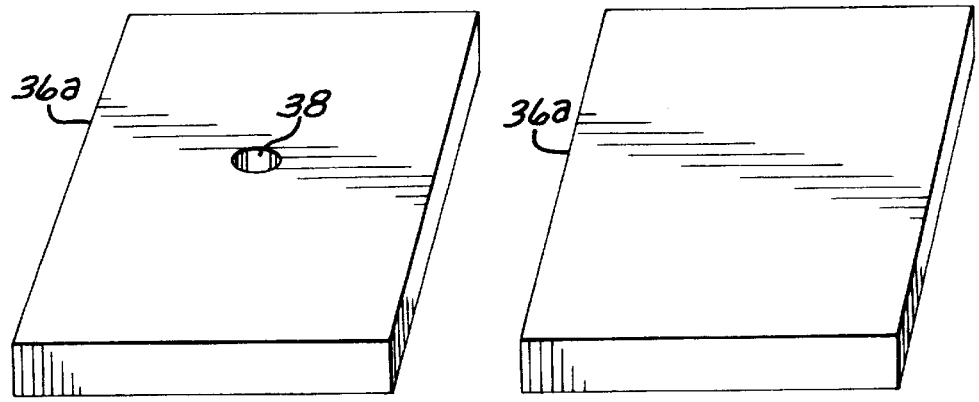
FIG. 5 is a perspective view of a shell cover having an opening therein.
FIG. 6 is a perspective view of a shell cover having no opening therein.

A cover 36 optionally overlies and protects the integrated circuit(s) 34. The cover 36 may be of any operable type. The cover 36 may be a hollow shell 36a, as shown in FIG. 2. The hollow shell cover 36a cover may have an opening 38 therethrough, as illustrated in FIG. 5, or it may have no opening 38 therethrough, as illustrated in FIG. 6. The reason for the opening 38 in some forms of the shell cover will be discussed subsequently. The cover 36 may instead be a flowable encapsulant 36b, illustrated in FIG. 3, such as epoxy. The hollow shell cover 36a may be removed to allow access to the integrated circuit(s) 34 for rework, while the flowable encapsulant 36b is typically non-reworkable. There may instead no cover, as illustrated in FIG. 4.

The compliant layers 28 and 30 are relatively much less stiff (i.e., softer and more compliant) than the integrated circuit(s) 34 and the backbone layer 26. After the entire assembly 20 is joined together and its temperature is changed for any reason, any difference in thermal expansion coefficient of the components would induce thermal strains and thermal stresses in the assembly 20 in the absence of the compliant layers 28 and 30. Specifically, the integrated circuit(s) 34 typically have a much smaller thermal expansion coefficient than the does the base board 22. When the temperature is raised in the absence of the compliant layers 28 and 30, the base board 22 expands more than do the integrated circuit(s) 34. The resulting thermal strain may cause the solder balls 32 to crack.

When the compliant layers 28 and 30 are present, on the other hand, they tend to absorb the thermal strain in their relatively soft material. Less thermal stress is imposed on the solder balls 32 and other components of the integrated circuit assembly 20. Consequently, there is a lesser tendency of the integrated circuit assembly 20 to fail in these thermal cycling conditions.

In the absence of the compliant layer(s), the solder balls may not be vertically positioned and registered directly under the integrated circuit or die due to the high coefficient of thermal expansion mismatch between the interposer and the base board, which would cause the solder balls to fail. With the use of the compliant layer(s) of the present invention, the solder balls may be positioned vertically (i.e., registered) under the integrated circuit or die. That is, the solder balls 32 may be positioned along the shortest path from the integrated circuits 34 to the base board 22. This short path length reduces the thermal impedance of heat flow from the integrated circuits 34, through the interposer 24, through the solder balls 32, and to the base board 22 which serves as a heat sink. The short path length improves heat flow from the integrated circuits 34 and from the interposer 24 to the base board 22, as compared with other practices wherein the solder balls are laterally displaced from the integrated circuits 34 to create a longer heat flow path.

Figure 7:
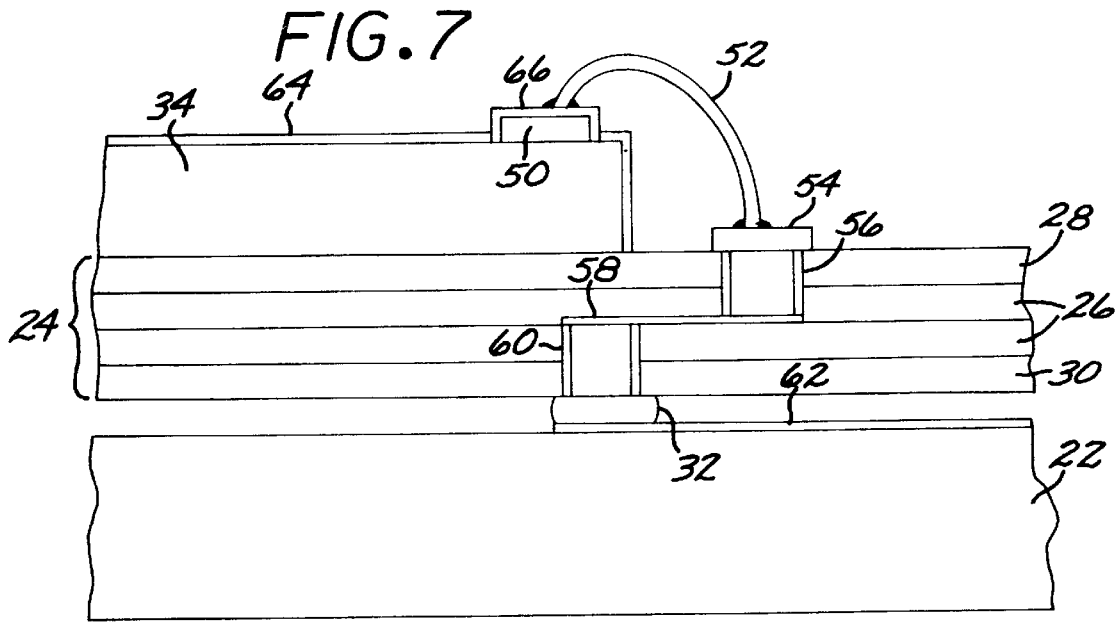
FIG. 7 is an enlarged detail of FIG. 2, taken in region 7—7.

Electrical signals flow bidirectionally between the integrated circuit 34 and the base board 22. FIG. 7 illustrates the electrical paths in the integrated circuit assembly 20 in greater detail, for one embodiment of the invention. Starting at the integrated circuit 34, the integrated circuit 34 includes copper-nickel/gold or titanium-tungsten/gold coated aluminum integrated circuit bonding pad(s) 50 thereon. A wire-bond wire 52 extends from the integrated-circuit bonding pad 50 to an interposer gold bonding pad 54 located on a top surface of the interposer 24. The wire-bond wire 52 is bonded, usually by welding, to the pads 50 and 54. The interposer bonding pad 54 is in electrical communication with a vertical conductor that conducts the electrical signal through at least a part of the thickness of the interposer 24. The illustrated vertical conductor is a plated through hole 56, which is a vertical hole whose walls are plated with a metallic electrical conductor. Other operable approaches, such as a solid metallic via, may be used. The plated through hole 56 may extend to a bottom surface of the interposer. 24 where the solder balls 32 are located. More generally, the plated through hole 56 extends only a portion of the distance through the interposer 24 and is in electrical communication with an electrically conductive interposer trace 58 on one of the backbone layers 26. The electrically conductive interposer trace 58 conducts the electrical signal laterally across the interposer 24 and is in electrical communication with another plated through hole 60. The plated through hole 60 extends the remainder of the distance through the interposer 24 and is in electrical communication with the solder ball 32. The electrical signal is communicated through the plated through hole 60 and the solder ball 32 to a base board trace 62 on the base board 22. The base board trace 62 extends to other electrical components mounted similarly to the base board 22, or to external interconnects.

One concern in the production of integrated circuit assemblies 20 is that the integrated circuit 34 and its integrated-circuit bonding pad 50 may be exposed to corrosive agents that may cause damage. To protect against such corrosion, it is common practice to cover the integrated circuit 34, except for the integrated-circuit bonding pad 50, with a protective coating 64 of an inert material such as silicon nitride or silicon oxide. This leaves the integrated-circuit bonding pad 50 vulnerable to corrosion.

In the present approach, the integrated-circuit bonding pads 50 are protected with a metallic bonding pad protective coating 66. Presently preferred bonding pad protective coatings 66 include a layer of titanium-tungsten or copper-nickel overlying the bonding pad 50, and a layer of gold overlying the layer of titanium-tungsten or copper-nickel. These protective coatings are indicated, respectively, as titanium-tungsten/gold and copper-nickel/gold. The wire 52 is bonded to the metallic bonding pad protective coating 66.

In another type of interconnection approach illustrated in FIG. 4, integrated circuit bonding pads 50 on the integrated circuit 34 are registered with and soldered directly to the bonding pads 54 on the interposer 24. That is, there is no wire-bond wire 52. In this "flip chip" approach, the standard flip-chip bumping and underfill process may be used.

This protection of the integrated circuit bonding pads 50 with the coating 66, together with the protection of the integrated circuit 34 by the integrated circuit protective coating 64, renders the integrated circuit 34 highly resistant to attack by a wide variety of corrosive agents. Consequently, integrated circuit assemblies 20 that otherwise would have to be enclosed within a hermetic package may now be enclosed within a non-hermetic package. The use of a non-hermetic package has important advantages. First, it is easier to perform the assembly of a non-hermetic package than a hermetic package. Second, rework of the integrated circuit assembly is easier.

Figure 8:
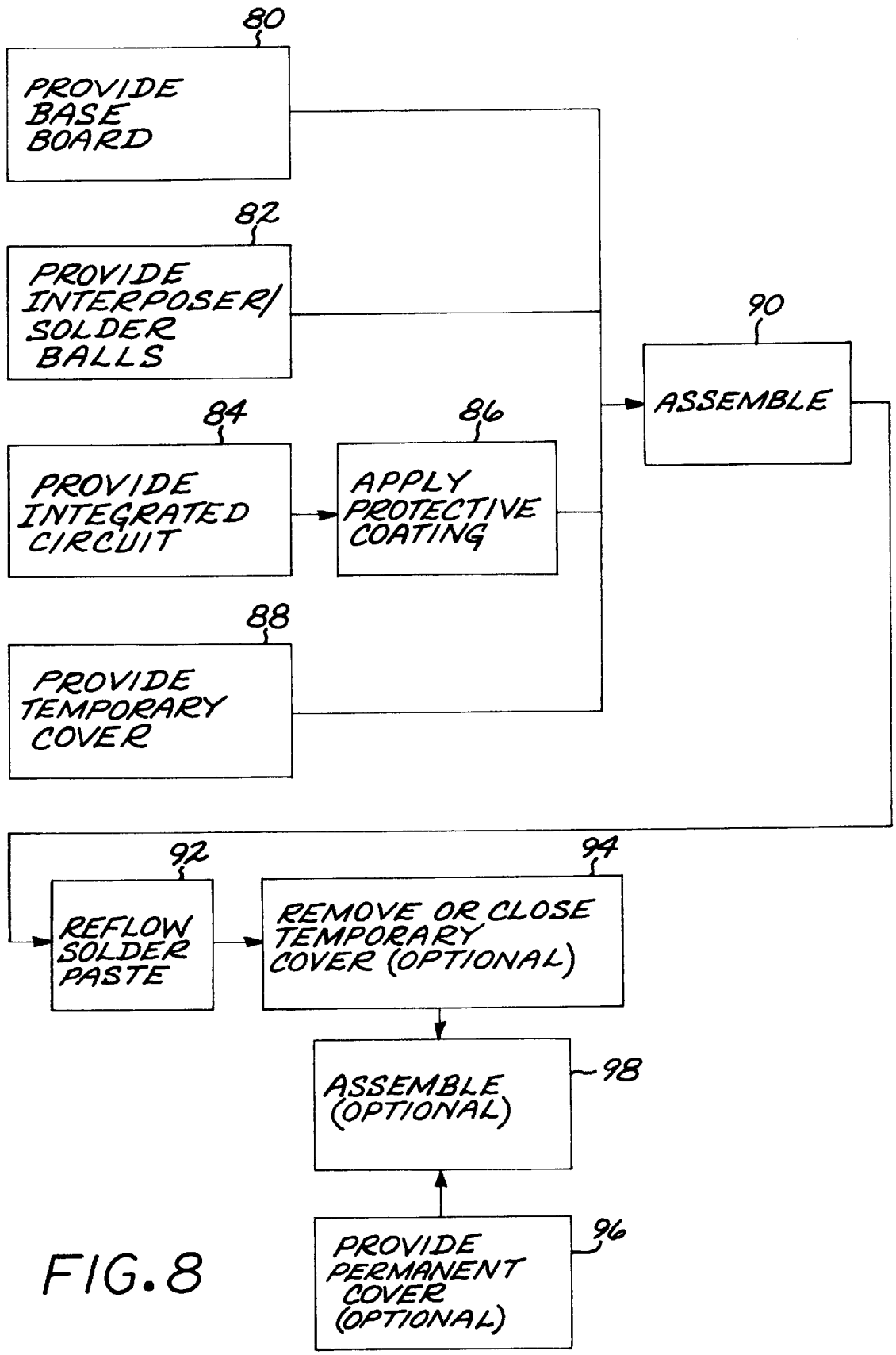
FIG. 8 is a block flow diagram of an approach to practicing the invention.

FIG. 8 depicts an approach for practicing the invention. The base board 22 is provided, numeral 80, with a low-melting-point solder paste stencil printed on top of the base board traces 62. The solder paste preferably is a lead-tin-base solder which has a melting point less than that of the solder balls 32. The interposer 24 is provided, numeral 82, with solder balls 32 already in place The integrated circuit 34 is provided, numeral 84. The manufacture of these components 22, 24/32, and 34 is known in the art, except for the alloy composition of the'solder bumps 32 and the coating 66. Preferably, the bonding-pad protective coating 66 is applied to the integrated circuit 34, numeral 86. This coating 66 is applied by sputtering and electrodeposition. A temporary cover 36a having the opening 38 is provided, numeral 88.

These components 22, 24/32, 34 (preferably with the protective coating 66), and 88 are assembled as illustrated in FIGS. 1–2, numeral 90. The assembly is heated to a temperature above the melting point of the solder paste (but below the melting point of the solder balls) which was stencil printed on top of the base board traces 62 to reflow the solder paste, numeral 92, and thereby join the solder balls 32 to their respective base board traces 62. The use of the temporary cover 36a with the opening 38 therein is desirable in this stage of the processing. During reflow processing 92, gas within the volume enclosed by the cover 36a expands. In the absence of the opening 38, the expanding gas could cause the cover to fail or pop off. The opening 38, which may be very small such as pinhole size, allows pressure equalization. between the interior and the exterior of the cover 36a, avoiding this problem.

The temporary cover 92 may be left in place, and the processing is complete at this point (so that the temporary cover becomes permanent in this embodiment). Optionally and more preferably, the temporary cover 36a is either replaced with a permanent cover such as the permanent cover 36b or the opening 38 is closed, numeral 94. If the opening 38 is to be closed and the temporary cover 36a is left in place, the opening 38 may be closed by any operable technique such as a piece of tape over the opening, a cover over the opening 38 held in place by adhesive, a solder blob over the opening, and the like. If the temporary cover 36a is to be replaced, it is removed and the permanent cover such as the cover 36b is provided, numeral 96. The permanent cover 36b is then assembled to the components 22, 24/32, and 34 and fastened in place, as with an adhesive, brazing, and the like, numeral 98.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An integrated circuit assembly, comprising:
    a base board;
    an interposer, the interposer comprising
        a backbone layer having a backbone stiffness, wherein the backbone layer is made of a fiber-reinforced polymeric material, and
        at least one compliant layer contacting the backbone layer, the compliant layer having a compliant-layer stiffness of less than the backbone stiffness, wherein each compliant layer is made of a compliant polymeric material which is not fiber reinforced;
    an array of solder balls electrically and structurally interconnecting the interposer and the base board; and
    an integrated circuit supported on the interposer.

2. The integrated circuit assembly of claim 1, wherein the interposer comprises
    the backbone layer having the backbone stiffness,
    a first compliant layer affixed to the backbone layer between the backbone layer and the integrated circuit, the first compliant layer having a first-layer stiffness of less than the backbone stiffness, and
    a second compliant layer affixed to the backbone layer between the backbone layer and the solder balls, the second compliant layer having a second-layer stiffness of less than the backbone stiffness.

3. The integrated circuit assembly of claim 1, wherein the interposer comprises
    the backbone layer having the backbone stiffness,
    a first compliant layer affixed to the backbone layer between the backbone layer and the integrated circuit, the first compliant layer having the compliant-layer stiffness of less than the backbone stiffness, and
    a second compliant layer affixed to the backbone layer between the backbone layer and the solder balls, the second compliant layer having the same compliant-layer stiffness as the first compliant layer.

4. The integrated circuit assembly of claim 1, wherein the solder balls are formed of a lead-tin-base solder having a melting temperature of greater than about 210° C.

5. The integrated circuit assembly of claim 1, further including
    a cover overlying and protecting the integrated circuit.

6. The integrated circuit assembly of claim 5, wherein the cover has an opening therethrough.

7. The integrated circuit assembly of claim 5, wherein the cover has no opening therethrough.

8. The integrated circuit assembly of claim 5, wherein the cover is a shell.

9. The integrated circuit assembly of claim 5, wherein the cover is a flowable encapsulant.

10. The integrated circuit assembly of claim 1 further including
    an integrated circuit protective coating overlying the integrated circuit.

11. The integrated circuit assembly of claim 1, wherein the integrated circuit includes integrated-circuit bonding pads thereon, and further including
    a bonding pad protective coating overlying the integrated-circuit bonding pads.

12. The integrated circuit assembly of claim 1, further including
    an electrical interconnect extending from the integrated circuit to at least one of the solder balls.

13. The integrated circuit assembly of claim 1, wherein the solder balls are vertically registered below the integrated circuit.

14. An integrated circuit assembly, comprising:
    a base board;
    an integrated circuit having integrated-circuit bonding pads thereon, there being a bonding pad protective coating overlying the integrated-circuit bonding pads;
    an interposer, the interposer comprising
        a backbone layer having a backbone stiffness,
        a first compliant layer affixed to the backbone layer between the backbone layer and the integrated circuit, the first compliant layer having a first-layer stiffness of less than the backbone stiffness, and
        a second compliant layer affixed to the backbone layer between the backbone layer and the base board, the second compliant layer having a second-layer stiffness of less than the backbone stiffness;
    an array of solder balls electrically and structurally interconnecting the interposer and the base board;
    an electrical interconnect extending from the integrated circuit to at least one of the solder balls; and
    a shell cover overlying and protecting the integrated circuit, wherein the cover has an opening therethrough.

15. The integrated circuit assembly of claim 14, wherein first-layer stiffness and the second-layer stiffness are the same.

16. The integrated circuit assembly of claim 14, wherein the solder balls are formed of a lead-tin-base solder having a melting temperature of greater than about 210° C.

17. The integrated circuit assembly of claim 14, wherein the bonding pad protective coating comprises a layered metal selected from the group consisting of titanium-tungsten/gold and copper-nickel/gold.

18. An integrated circuit assembly, comprising:
    a base board;
    an interposer, the interposer comprising
        a backbone layer having a backbone stiffness, and
        at least one compliant layer contacting the backbone layer, the compliant layer having a compliant-layer stiffness of less than the backbone stiffness,
    an array of solder balls electrically and structurally interconnecting the interposer and the base board;
    an integrated circuit supported on the interposer; and
    a shell cover overlying and protecting the integrated circuit, wherein the shell cover has an opening therethrough.

19. The integrated circuit assembly of claim 1 further including
    an integrated circuit protective coating overlying the integrated circuit.

20. The integrated circuit assembly of claim 1, wherein the integrated circuit includes integrated-circuit bonding pads thereon, and further including
    a bonding pad protective coating overlying the integrated-circuit bonding pads.

* * * * *